(12) United States Patent
Kim et al.

(10) Patent No.: US 11,445,613 B2
(45) Date of Patent: Sep. 13, 2022

(54) METHOD FOR MANUFACTURING TOUCH DEVICE AND RESIN COMPOSITION THEREOF

(71) Applicant: LG DISPLAY CO., LTD., Seoul (KR)

(72) Inventors: NakWon Kim, Seoul (KR); SeungKyu Choi, Goyang-si (KR); Seongjae Hong, Daegu (KR); Dongwook Shin, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 187 days.

(21) Appl. No.: 16/734,926

(22) Filed: Jan. 6, 2020

(65) Prior Publication Data

US 2020/0146152 A1    May 7, 2020

Related U.S. Application Data

(62) Division of application No. 14/502,765, filed on Sep. 30, 2014, now Pat. No. 10,548,224.

(30) Foreign Application Priority Data

Dec. 30, 2013 (KR) ........................ 10-2013-0167355

(51) Int. Cl.
*H05K 1/18* (2006.01)
*C09D 161/06* (2006.01)
(Continued)

(52) U.S. Cl.
CPC ............. *H05K 1/189* (2013.01); *C03C 15/00* (2013.01); *C09D 133/14* (2013.01);
(Continued)

(58) Field of Classification Search
None
See application file for complete search history.

(56) References Cited

U.S. PATENT DOCUMENTS

| | | | |
|---|---|---|---|
| 2002/0028302 | A1 | 3/2002 | Okazaki et al. |
| 2002/0051942 | A1 | 5/2002 | Takeuchi et al. |

(Continued)

FOREIGN PATENT DOCUMENTS

| | | |
|---|---|---|
| CN | 101578288 A | 11/2009 |
| CN | 101747835 A | 6/2010 |

(Continued)

OTHER PUBLICATIONS

"Barium Sulfate," Wikipedia, the free encyclopedia, (current version of definition available at https://en.wikipedia.org/wiki/Barium_sulfate), Nov. 18, 2013, pp. 1-5.

(Continued)

*Primary Examiner* — Megan McCulley
(74) *Attorney, Agent, or Firm* — Birch, Stewart, Kolasch & Birch, LLP

(57) ABSTRACT

Discussed is a method for manufacturing a touch device, the method including forming a protective layer per touch sensor on first and second surfaces of a mother substrate on which two or more touch sensors are formed; dividing the mother substrate into two or more substrates of a touch sensor unit by mechanically cutting or chemically treating the mother substrate; chemically strengthening an edge of each of the divided substrates; and removing the protective layer from at least one divided substrate.

5 Claims, 7 Drawing Sheets

(51) Int. Cl.
 *C09D 133/14*  (2006.01)
 *C03C 15/00*  (2006.01)
 *G06F 3/041*  (2006.01)

(52) U.S. Cl.
 CPC ...... *C09D 161/06* (2013.01); *C03C 2218/355* (2013.01); *G06F 3/041* (2013.01); *G06F 2203/04103* (2013.01); *Y10T 428/24355* (2015.01)

(56) References Cited

U.S. PATENT DOCUMENTS

| | | |
|---|---|---|
| 2004/0067440 A1 | 4/2004 | Minegishi et al. |
| 2006/0207187 A1 | 9/2006 | Gaeta et al. |
| 2006/0208219 A1 | 9/2006 | Imaizumi et al. |
| 2010/0113639 A1 | 5/2010 | Döring et al. |
| 2010/0197848 A1 | 8/2010 | Verghese et al. |
| 2010/0292415 A1 | 11/2010 | Reynolds et al. |
| 2012/0052302 A1 | 3/2012 | Matusick et al. |
| 2013/0147720 A1 | 6/2013 | Yilmaz |
| 2016/0376446 A1 | 12/2016 | Gibanel et al. |

FOREIGN PATENT DOCUMENTS

| | | |
|---|---|---|
| CN | 102819190 A | 12/2012 |
| CN | 103108842 A | 5/2013 |
| JP | 2000-226498 A | 8/2000 |
| KR | 10-2011-0013495 A | 2/2011 |
| KR | 10-2013-0092713 A | 8/2013 |
| WO | WO 2013/141286 A1 | 9/2013 |

OTHER PUBLICATIONS

"Phenol Formaldehyde Resin," Wikipedia, the free encyclopedia, (current version of definition available at https://en.wikipedia.org/wiki/Phenol_formaldehyde_resin), Dec. 19, 2013, pp. 1-5.

"Surface Roughness," Wikipedia, the free encyclopedia, (current version of definition available at, https://en.wikipedia.org/wiki/Surface_roughness), Nov. 5, 2013, pp. 1-5.

METHOD FOR MANUFACTURING TOUCH DEVICE AND RESIN COMPOSITION THEREOF

CROSS-REFERENCE TO RELATED APPLICATION

This Application is a Divisional of U.S. application Ser. No. 14/502,765, filed on Sep. 30, 2014, which claims priority from and the benefit under 35 U.S.C. § 119(a) of Korean Patent Application No. 10-2013-0167355, filed on Dec. 30, 2013, all of these applications are hereby incorporated by reference for all purposes as if fully set forth herein.

BACKGROUND OF THE INVENTION

Field of the Invention

The present invention relates to a method for manufacturing a touch device to input information by touch.

Description of the Related Art

As the weight of a display is light and the size of the display is slim, so a touch device is gradually being introduced in order to replace a keyboard or a mouth which needs the additional weight and space. Such the touch device may provide a user interface with the high intuitive in terms of capable of recognizing the user's operations at the same position as an image displayed on a screen.

Although the touch device provides the user interface with the high intuitive, the productivity is low and the processing costs are gradually increasing so that the touch device may be limited to be used in the display device.

SUMMARY OF THE INVENTION

Accordingly, the present invention has been made to address the above-mentioned and other problems occurring in the related art, and an object of the present invention is to provide a touch device, a method for manufacturing a touch device and a resin composition used in the method thereof which can improve productivity and cut down processing costs.

According to one embodiment, there is provided a touch device including: a substrate whose surface roughness is less than 1.2 nm, a touch sensor formed on a surface of the substrate and a flexible printed circuit board attached to the substrate.

According to another embodiment, there is provided a resin composition to prevent damage of a surface of a substrate from an etchant when an edge thereof is strengthened. The resin composition includes a resin mixture of 20~50% by weight which includes a phenol resin and a epoxy acrylate resin with a weight ratio of 10:90 to 90:10, and a solvent.

According to another embodiment, a method for manufacturing a touch device, includes forming a protective layer per a touch sensor on a first and a second surfaces of a mother substrate on which two or more touch sensors are formed, dividing the mother substrate into two or more substrates of the touch sensor unit by mechanically cutting or chemically treating the mother substrate, chemically strengthening an edge of each of the substrates and removing the protective layer from the substrate.

Accordingly, according to various embodiments, it is possible to improve productivity and cut down processing costs associated with touch devices.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
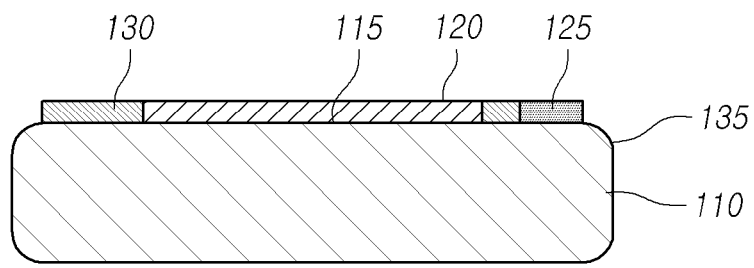
FIG. 1 illustrates a sectional view of a touch device according to one embodiment of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

The present specification may is referred to an edge of a substrate as one of a side surface of the substrate, an edge surface of the substrate, both a side surface of the substrate and an outer part of two surfaces.

FIG. 1 illustrates a sectional view of a touch device 100 according to one embodiment.

Referring to FIG. 1, the touch device 100 according to one embodiment may be an integrated type touch device on a substrate 110. A touch sensor 120 in integrated type touch device 100 may be integrated on a first surface 115 of the substrate 110, thereby making the device lighter and thinner, reducing a manufacturing cost, improving visibility for a display and enhancing sensitivity for the touch device 100.

The touch sensor 120 and a decoration 130 around the touch sensor 120 may be formed on the first surface 115 of the substrate 110 in the touch device 100.

The touch sensor 120 may include first electrodes positioned in a first direction such as a horizontal direction, and second electrodes positioned in a second direction such as a vertical direction.

An anti fingerprinted film may be attached on the substrate 110. A flexible printed circuit board (FPCB, 125) in which a touch integrated circuit and/or a controller is integrated, may be attached to one side of the first surface 115 of the substrate 110.

An edge 135 of the substrate 110 on which the touch sensor 120 is formed, is strengthened by a chemical treatment with an etchant. Either large or small cracks are removed from the edge or the side surface 135 of the substrate 110 with the touch sensor 120.

In detail, during manufacturing of the touch device 100 to be mentioned later with reference to FIGS. 2 to 7, the edge or the substrate 110 may be grinded by, for example, a chamfer, or chemically strengthened by being immersed in an etchant in a state that a protecting layer is formed on both surfaces so that only the edge thereof may be exposed. Therefore either large or small cracks may be removed from the edge or the side surface 135 of the substrate 110.

When examined by an optical microscope, the edge 135 of the substrate 110 may have a highly-smooth surface roughness or a high smoothness. When the edge 135 of the substrate 110 is examined by an atomic force microscope, a surface roughness thereof may, for example, less than 1.2 nm.

In order to manufacture the touch device 100 according to one embodiment as shown in FIG. 1, after a mother substrate may be divided into two or more substrates (110) per cell unit and an edge 135 of each 110 of the substrates is chemically strengthened, the touch sensor 120 and the decoration 130 may be formed on the substrate 110. Also, after two or more touch sensors are formed on the mother substrate and the mother substrate is divided into two or more substrates per touch sensor unit, the edge thereof may be strengthened.

In order to improve productivity and cut down processing costs, described below is a method for manufacturing the touch device in which after two or more touch sensors are formed on the mother substrate and the mother substrate is divided into two or more substrates per touch sensor unit. By this method the edge thereof may be strengthened.

Figure 2:
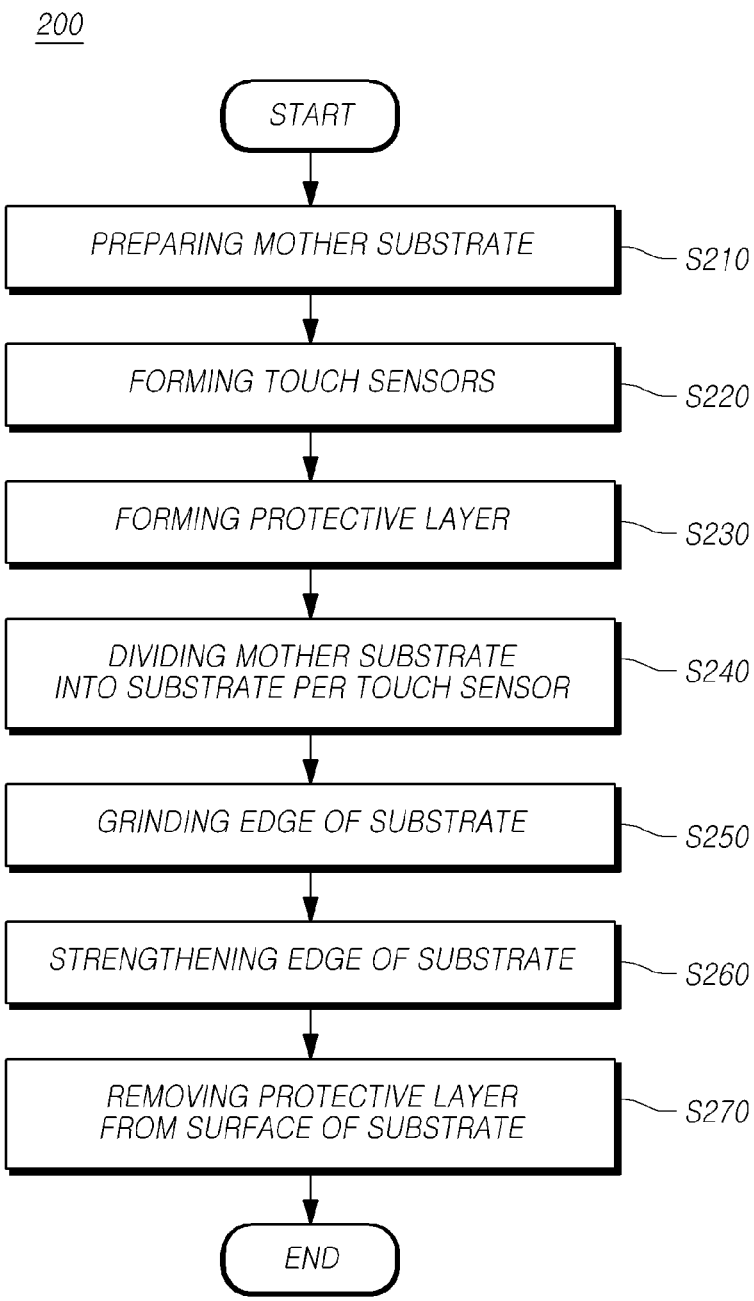
FIG. 2 illustrates a flowchart of a method for manufacturing the touch device according to an embodiment of the present invention.

FIG. 2 illustrates a flowchart of a method for manufacturing the touch device according to an embodiment. FIGS. 3 to 7 illustrate processes of a method 200 for manufacturing the touch device according to an embodiment.

Referring to FIG. 2, the method 200 for manufacturing the touch device may comprise one or more of preparing a mother substrate at S210, forming two or more touch sensors on the prepared mother substrate at S220, forming a protective layer on the mother substrate at S230, dividing the mother substrate at S240, grinding an edge of the substrate at S250, strengthening the edge of the substrate S260 and removing the protective layer at S270.

Figure 3:
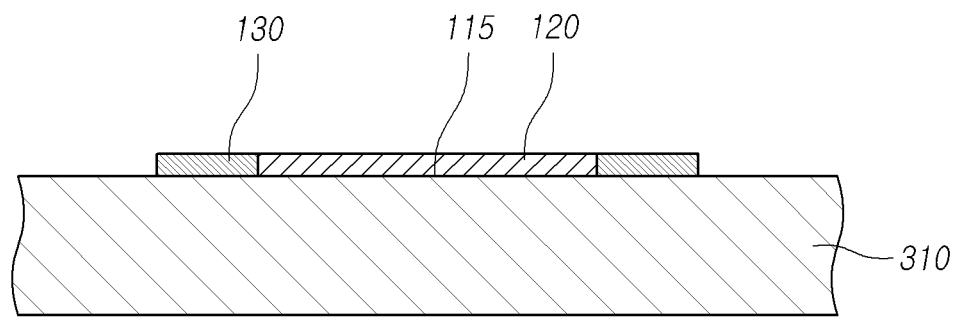
FIGS. 3 to 7 illustrate processes of a method for manufacturing the touch device according to an embodiment of the present invention.

In more detail, referring to FIG. 3, in the preparing the mother substrate at S210, the mother substrate 310 may be, but not limited to, a strengthened glass substrate. For example, the strengthened glass substrate may be a glass substrate which is obtained by thermally or chemically treating a soda lime glass or an alkali-free glass in order to enhance the hardness of the surface. Without separately performing the preparation of the mother substrate at S210, the following step may be performed by using the prepared mother substrate 310.

The process of forming the touch sensors can include forming two or more touch sensors 120 on the first surface 115 of the mother substrate 310. In this step S220, the respective decorations 130 along with two or more touch sensors 120 may be formed on the first surface 115 of the mother substrate 310. The touch sensors may comprise a first electrode positioned in the first direction and the second electrode positioned in the second direction respectively. For example, six touch sensors 120 (e.g., by 3×2 configuration) may be formed at specific intervals on the first surface 115 of the mother substrate 310. The decoration 130 may be formed around the touch sensor 120 per one cell/touch sensor unit.

Figure 4:
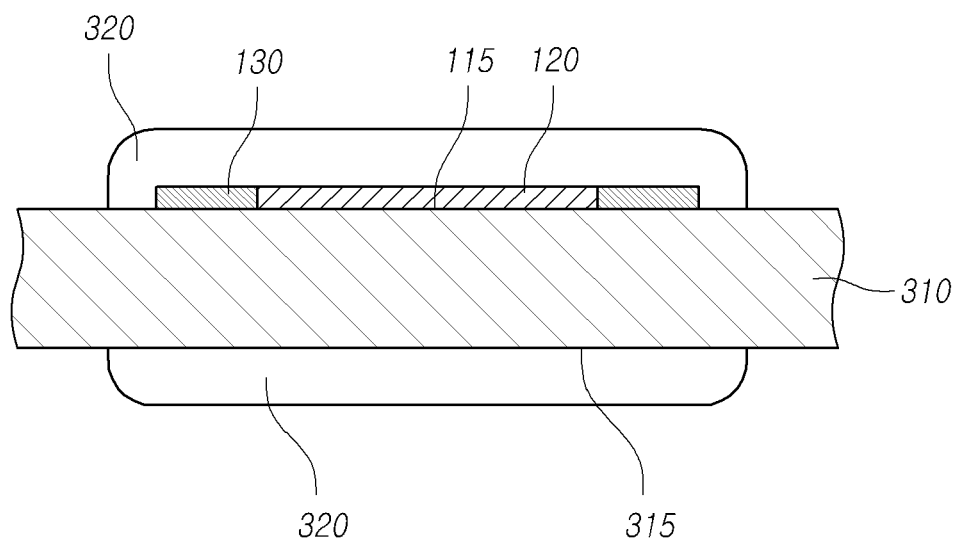

Referring to FIG. 4, in the process of forming the protective layer on the mother substrate at S230, the protective layer 320 is formed, by a printing process as an example, per one cell or touch sensor on the first surface 115 and the second surface 315 of the mother substrate 310 on which two or more touch sensors are formed. In this step at S230, the protective layer 320 may be formed by coating and then curing a paste of a resin composition per one cell or touch sensor on the first surface 115 and the second surface 315 opposite to the first surface 115 of the mother substrate 310 through the printing process such as a screen printing or a roll printing. The protective layer 320 may prevent damage of the substrate 110 and the touch sensor 120 from an etchant in the strengthening the edge thereof at S260 because it is necessary to protect the surface thereof before strengthening of the edge thereof. The protective layer 320 may be formed with an acid-resistant resin composition because the edge 335 of the substrate 110 is treated by the etchant which includes an acidic aqueous solution as a main component in the strengthening the edge thereof at S260.

The paste of the resin composition may be coated per one cell or touch sensor on the first surface 115 of the mother substrate 310, on which the above mentioned six touch sensors 115 (of 3×2) are formed, through the printing process such as the screen printing or the roll printing. The paste of the resin composition may be also coated per one cell or touch sensor on the second surface 315 of the mother substrate 310 through the printing process such as the screen printing or the roll printing.

The paste of the resin composition coated at specific intervals on the first surface 115 and the second surface 315 of the mother substrate 310 may be cured by, for example, being inserted into a firing furnace.

After the paste of the resin composition coated at specific intervals on the first surface 115 of the mother substrate 310 may be coated and then cured by, for example, being inserted into a firing furnace, the paste of the resin composition coated at specific intervals on the second surface 315 of the mother substrate 310 may be coated and then cured by, for example, being inserted into a firing furnace. Or vice versa.

In the process of forming the protective layer on the mother substrate at S230, the resin composition may be composed in order to be adapted to the printing process such as the screen printing or the roll printing.

The resin composition to prevent damage of a surface of the substrate 110 from an etchant when an edge 335 thereof is strengthened may include a resin mixture of 20~50% by weight which includes a phenol resin and a epoxy acrylate resin with a weight ratio of 10:90 to 90:10, and a solvent. Here, in one example, only the phenol resin and the epoxy acrylate resin may be included.

The solvent may be an organic solvent beneficial for dispersing the resin composition. The solvent may be 5 to 70% by weight when other ingredients are excluded from all of the resin composition. Further the solvent may be an organic solvent of which the boiling point is high enough to be able to prevent what the paste of the resin composition is not coated by being dried during the printing process. For example, the solvent may be selected from a group consisting of DPGME (Dipropylene Glycol Methyl Ether), butyl carbitol), Terpineol, PGMEA (Propylene Glycol Monomethyl Ether Acetate.

The phenol resin may be one of a novolac such as

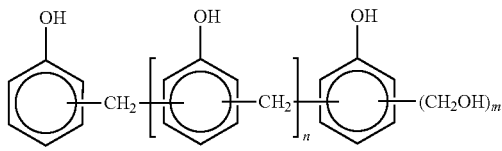

or a resole such as

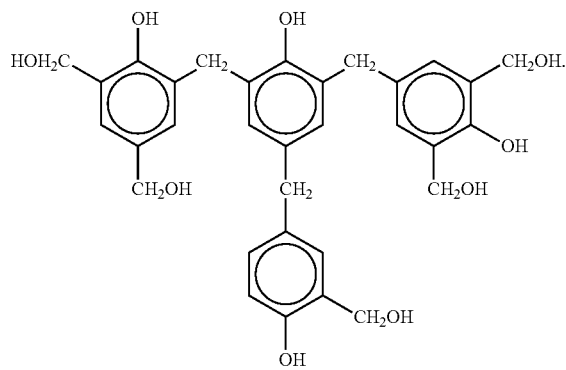

When the protective layer 320 is removed at S270, the phenol resin may be suitable for stripping a surface. When the protective layer 320 is immersed in the etchant 340 at S260, the phenol resin may be suitable for preventing the penetration of the etchant or acid-resistance. Further epoxy acrylate resin may accelerate the curing and improve the surface hardness when the paste of the resin composition is coated and cured on the first surface 115 of the mother substrate 310.

The appropriate weight ratio of the phenol resin and the epoxy acrylate resin may allow the resin composition to have characteristics adapted to strip the surface, prevent the penetration of the etchant (or acid-resistance) and improve the surface hardness. In other words, the weight ratio of the phenol resin and the epoxy acrylate resin may be determined by considering the performance of stripping the surface when the protective layer 320 is removed, the characteristic of preventing the penetration of the etchant (or acid-resistance) when immersed in the etchant 340, the characteristic of accelerating the curing or the surface hardness when coated and cured, and other characteristic of the paste. For example, the weight ratio of the phenol resin and the epoxy resin may be 10:90 to 90:10. If the phenol resin is less than 10% by weight, it is possible to decline the characteristic of preventing the penetration of the etchant (or acid-resistance) when immersed in the etchant 340. If the phenol resin is more than 90% by weight, it is possible to decline the performance of striping the surface when the protective layer 320 is removed. If the epoxy acrylate resin is less than 10% by weight, it is possible to decline the surface roughness when coated and cured. If the epoxy acrylate resin is more than 90% by weight, it is possible to decline the surface roughness when coated and cured.

In more detail, the weight ratio of the phenol resin and the epoxy resin may be 40:60 to 80:20. When the weight ratio of the phenol resin is 40 to 60 and the weight ratio of the epoxy acrylate resin is 20 to 60, it is confirmed that there are more improved features such as the improved performance of stripping the surface when the protective layer 320 is removed, the improved characteristic of preventing the penetration of the etchant (or acid-resistance) when immersed in the etchant 340, the improved characteristic of accelerating the curing or the surface hardness when coated and cured, and other improved characteristics of the paste.

The weight percentage of a resin mixture consisting of or including the phenol resin and the epoxy acrylate resin in the resin composition may be determined by considering the performance of striping the surface, the characteristic of preventing the penetration of the etchant (or acid-resistance), the characteristic of accelerating the curing or the surface hardness, and other characteristic of the paste as mentioned above. For example, the weight percentage of a resin mixture in all the resin composition as well as the weight ratio of the phenol resin and the epoxy acrylate resin may be determined by considering the above-mentioned characteristics. A viscosity of the resin composition may be 10,000~60,000 mPa·s at room temperature. For example, if the viscosity of the resin composition is less than 10,000 mPa·s at room temperature, it is difficult to perform the printing process because the paste of the resin composition is previously spread before the printing process. If the viscosity of the resin composition is more than 60,000 mPa·s at room temperature, it is difficult to transfer the paste of the resin composition when coated by the printing process of the paste of the resin composition. For example, the screen is blocked in the screen printing process and the roll is clunk/stuck in the roll printing process so that either the defect or the failure may occur in the printing process.

Considering the performance of striping the surface, the characteristic of preventing the penetration of the etchant (or acid-resistance), the surface hardness, and the viscosity of the resin composition as mentioned above, the resin mixture in all the resin composition may be 20 to 50% by weight. If the resin mixture in the resin composition is less than 20% by weight, the surface hardness may be lowered and the viscosity of the resin composition may be less 10,000 mPa·s at room temperature. If the resin mixture in the resin composition is more than 50% by weight, the viscosity of the resin composition may be more than 60,000 mPa·s at room temperature and as a result the printing failure may occur because of the difficulty of the transfer of the paste of the resin composition such as the blocking of the screen in the printing process and the clinging of the roll in the roll process.

The resin composition may mix other resin(s) into the above-mentioned resin composition and the solvent so that other properties may be obtained.

The resin composition according to the present invention may further include an elastomer to enhance/strengthen the surface elasticity and the impact resistance. The elastomer may be, but not limited to, 0 to 30% by weight among all the resin composition. The elastomer may be selected from a group consisting of an EPM (Ethylene propylene rubber), an EPDM (Ethylene propylene diene monomer rubber), a silicone rubber and a nitrile rubber, but is not limited thereto.

The resin composition according to the present invention may further include a photo initiator of less than 1% by weight. In order to give the curing performance by exposure, the photo initiator may be selected from a group consisting of dibenzoyl peroxide, dicumyl peroxide, tert-butyl peroxybenzoate and the like, but is not limited thereto.

The resin composition according to the present invention may further include a filler as well as the resin mixture and the solvent in order to give the printing process characteristics and aid in securing the film thickness. For example, the filler may be selected from a group consisting of calcium carbonate, barium sulfate, titanium dioxide and silica, but it is not limited thereto. The filler may be one of calcium carbonate and barium sulfate in reference with the kind and the proportion of the resin mixture and the kind of the solvent. The filler may be, not limited to, 10-50% by weight among all the resin composition. An average particle size of the filler powder may be equal to or less than 2 µm, but it is not limited thereto. For example, if the average particle size of the filler powder is more than 2 µm, the filler may be not dispersed uniformly in the resin composition or the performance of the film may be lowered.

The resin composition according to the present invention may further include an additive of less than 1% by weight such as anti-foaming agents, leveling agents and anti-erosive/anti-abrasive agents generally used in the composition in order to improve the performance of the dispersion and the membrane for the paste component, but is not limited thereto.

Figure 5:
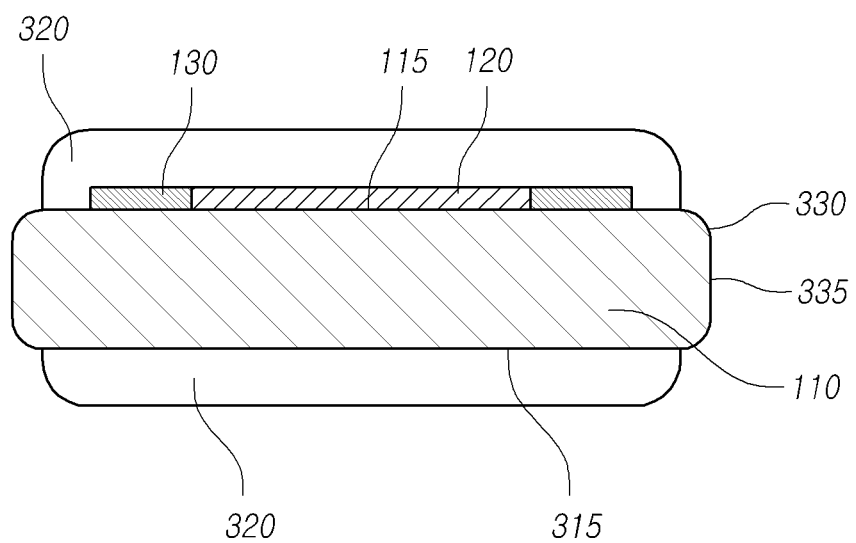

Referring to FIG. 5, in the process of dividing the mother substrate at S240, the mother substrate 310 may be divided into two or more substrates 110 of the touch sensor unit by being mechanically cut or chemically treated.

In other words, in this step at S240, the mother substrate 310 may be divided into two or more substrates of the touch sensor unit by being mechanically cut with a cutter. In another example, in this step S240, the mother substrate 310 may be divided into two or more substrates (110) of the touch sensor unit by being chemically treated with the etchant.

In the process of grinding the edge of the substrate 110 at S250, the edge of the divided substrate 110 may be grinded by using, for example, a wheel grinder. Therefore the large cracks or the macro cracks may be removed by grinding the edge of the mechanically cut substrate at S250. In detail, the chamfer 330 of the edge of the mechanically cut substrate 110 may be sequentially performed by using the wheel grinder so that the large cracks may be removed from the substrates (110) at S250.

However, the process of grinding the edge of the substrate at S250 may be omitted and the following step may be performed when the cracks of the edge of the divided substrate is sufficiently removed by being mechanically cut at S250 and/or being chemically treated at S260.

Figure 6:
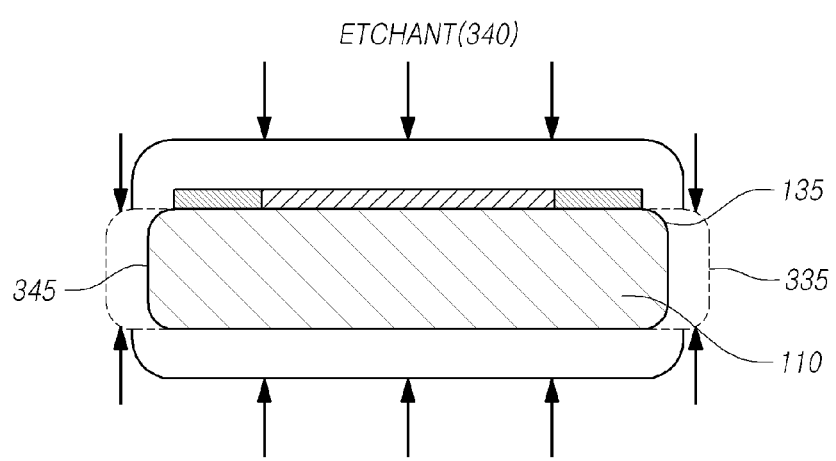

Referring to FIG. 6, in the process of strengthening the edge of the substrate 110 at S260, the edge 335 of the divided substrate 110 of the touch sensor unit may be chemically strengthened. In this step S260, the divided substrate 110 of the touch sensor unit may be immersed in the etchant 340 so as remove the small cracks or the microcracks. In this step S260, a predetermined portion 345 (i.e., the etched portion) of the edge 335 of the substrate 110 is etched to be strengthened so that the edge 115 of the substrate may be completed.

For example, the divided substrate 110 may be immersed in the etchant including an acidic aqueous solution such as a hydrofluoric acid solution with hydrofluoric acid of about 10% as a main component by using a chemical healing method. As for the etchant, it is possible to suitably use a mixed acid containing at least one of hydrofluoric acid, sulfuric acid, nitric acid, hydrochloric acid, and hydrofluorosilicic acid. In this step S260, the etching process is not limited to the process of simply immersing the substrate into the etchant or the etching solution, but instead it is possible to employ, for example, spray etching in which the etchant or the etching solution is sprayed.

Figure 7:
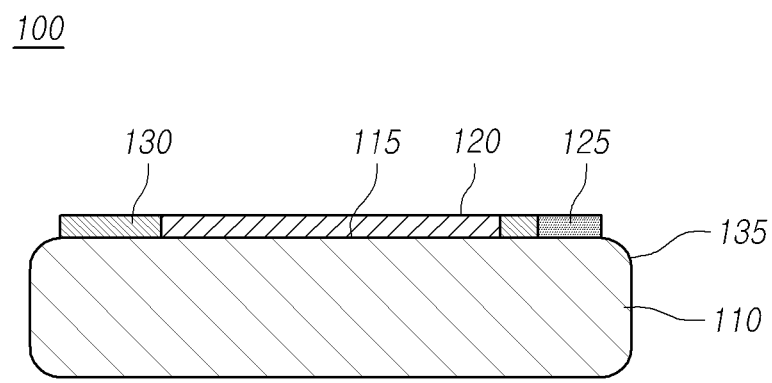

Referring to FIG. 7, the protective layer 320 may be removed from the substrate 110 so that the touch device 100 may be completed.

In this step S270, the substrate 110 on which the protective layer 320 is formed may be either immersed in a stripper or sprayed with the stripper so that the protective layer 320 may be removed.

The stripper or the stripping solution for stripping the protective layer 320 may be an organic solvent mixture or an aqueous alkaline solution depending on the kind and the mixing ratio of the resin composition, and the mixing combination used for forming the protective layer 320, but is not limited thereto. For example the stripper may be the aqueous alkaline solution such as an aqueous potassium hydroxide solution or an aqueous amine-based solution for recycling. The substrate 110 may be sufficiently washed by a washing liquid in order to prevent corrosion of the pattern of touch sensor.

After the substrate 110 is sufficiently washed by the washing liquid, the decoration 130 may be reinforced around the touch sensor 120 by further printing processes. The anti fingerprinted film may be attached on the substrate 110 for protecting the touch sensor 120 and the flexible printed circuit board (FPCB, 125) in which a touch integrated circuit and/or a controller is integrated, may be attached to one side of the first surface 115 of the substrate 110 so that the touch device 100 may be completed.

In the above-mentioned embodiment(s), there may form the proactive layer 320 with the resin composition on the touch sensor before the process of strengthening the edge of the substrate on which the touch sensor is formed. This can effectively prevent the damage of the surface of the substrate 110 due to the etchant in the process of strengthening the edge of the substrate.

In the above-mentioned embodiment(s), the paste of the resin composition can be coated on the substrate by the printing process so as to simplify the coating process and relatively easily perform the stripping process after strengthening the substrate.

Although various embodiments have been described up to now with reference to the accompanying drawings, the present invention is not limited thereto. For example, the type of the additives of the resin composition, the etchant, and the stripper may be selected as appropriate depending on the material(s) of the substrate, the various processes and the like.

Although preferred embodiments of the present invention have been described for illustrative purposes, those skilled in the art will appreciate that various modifications, additions and substitutions are possible, without departing from the scope and spirit of the invention as disclosed in the accompanying claims. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A method for manufacturing a touch device, the method comprising:
    forming a protective layer per touch sensor on first and second surfaces of a mother substrate on which two or more touch sensors are formed;

dividing the mother substrate into two or more substrates of a touch sensor unit by mechanically cutting or chemically treating the mother substrate;
chemically strengthening an edge of each of the divided substrates; and
removing the protective layer from at least one divided substrate,
wherein in the forming of the protective layer, the protective layer is formed by coating a paste of a resin composition comprising a resin mixture of 20~50% by weight which includes a phenol resin and an epoxy acrylate resin with a weight ratio of 10:90 to 90:10, and a solvent of 5 to 70% by weight on the first and second surfaces of the mother substrate,
wherein the resin composition further comprises a filler of 10~50% by weight selected from a group consisting of calcium carbonate, barium sulfate, titanium dioxide and silica,
wherein the solvent is selected from a group consisting of dipropylene glycol methyl ether, butyl carbitol, and terpineol,
wherein the phenol resin is one of a novolac or a resol, and
wherein in the removing of the protective layer, the protective layer is stripped by one of an aqueous potassium hydroxide solution or an aqueous amine-based solution.

2. The method as claimed in claim 1, wherein the resin composition further comprises an elastomer and a photo initiator of 1 to 50% by weight together.

3. The method as claimed in claim 2, wherein the elastomer is selected from a group consisting of an Ethylene propylene rubber, an Ethylene propylene diene monomer rubber, a silicone rubber and a nitrile rubber.

4. The method as claimed in claim 1, wherein a viscosity of the resin composition is 10,000~60,000 mPa·s at room temperature.

5. The method as claimed in claim 1, wherein the filler has an average particle size of approximately 2 μm.

* * * * *